US012795834B2

(12) United States Patent
Shin et al.

(10) Patent No.: US 12,795,834 B2
(45) Date of Patent: Nov. 10, 2026

(54) PRINTED CIRCUIT BOARD

(71) Applicant: LG INNOTEK CO., LTD., Seoul (KR)

(72) Inventors: Jong Bae Shin, Seoul (KR); Soo Min Lee, Seoul (KR); Jae Hun Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 133 days.

(21) Appl. No.: 18/910,822

(22) Filed: Oct. 9, 2024

(65) Prior Publication Data

US 2025/0031312 A1 Jan. 23, 2025

Related U.S. Application Data

(63) Continuation of application No. 17/770,757, filed as application No. PCT/KR2020/014386 on Oct. 21, 2020, now Pat. No. 12,144,116.

(30) Foreign Application Priority Data

Oct. 21, 2019 (KR) ........................ 10-2019-0130455

(51) Int. Cl.
*H05K 1/18* (2026.01)
*H05K 1/11* (2006.01)
*H05K 1/183* (2026.01)
*H05K 1/185* (2026.01)

(52) U.S. Cl.
CPC ............. *H05K 1/185* (2013.01); *H05K 1/111* (2013.01); *H05K 1/183* (2013.01); *H05K 1/11* (2013.01); *H05K 1/18* (2013.01)

(58) Field of Classification Search
CPC ........ H05K 1/18; H05K 1/185; H05K 3/4697; H05K 1/11; H05K 1/183; H10W 70/60
USPC .......................................................... 174/250
See application file for complete search history.

(56) References Cited

U.S. PATENT DOCUMENTS

| | | | |
|---|---|---|---|
| 7,056,595 B2 | 6/2006 | Hasegawa et al. |
| 7,138,188 B2 | 11/2006 | Hasegawa et al. |
| 7,858,437 B2 | 12/2010 | Jung et al. |
| 8,101,868 B2 | 1/2012 | Ito et al. |

(Continued)

FOREIGN PATENT DOCUMENTS

| | | |
|---|---|---|
| CN | 103703874 | 4/2014 |
| CN | 111148347 | 5/2020 |

(Continued)

OTHER PUBLICATIONS

International Search Report dated Feb. 3, 2021 issued in Application No. PCT/KR2020/014386.

(Continued)

*Primary Examiner* — Tremesha W Burns
(74) *Attorney, Agent, or Firm* — KED & ASSOCIATES, LLP

(57) ABSTRACT

A printed circuit board according to an embodiment includes a first insulating layer, a second insulating layer disposed on the first insulating layer and including a cavity; and a pad disposed on the first insulating layer and having an upper surface exposed through the cavity; wherein the cavity includes a first part including a first inner wall; and a second part including a second inner wall under the first part; and wherein an inclination angle of the first inner wall is different from an inclination angle of the second inner wall.

20 Claims, 9 Drawing Sheets

(56) References Cited

U.S. PATENT DOCUMENTS

| | | | |
|---|---|---|---|
| 8,785,788 | B2 | 7/2014 | Shimizu et al. |
| 9,005,456 | B2 | 4/2015 | You |
| 9,282,626 | B2 | 3/2016 | Yoo |
| 9,526,177 | B2 | 12/2016 | Lee et al. |
| 9,723,729 | B2 | 8/2017 | Furusawa et al. |
| 10,103,113 | B2 | 10/2018 | Ko et al. |
| 10,453,788 | B2 | 10/2019 | Lee et al. |
| 10,524,361 | B2 | 12/2019 | Ogawa |
| 10,950,587 | B2 | 3/2021 | Jeon et al. |
| 2004/0151920 | A1 | 8/2004 | Hasegawa et al. |
| 2005/0221126 | A1 | 10/2005 | Hasegawa et al. |
| 2014/0001897 | A1 | 1/2014 | Wallrafen |
| 2014/0321084 | A1 | 10/2014 | Lee |
| 2016/0120033 | A1 | 4/2016 | Furusawa |
| 2017/0019993 | A1 | 1/2017 | Tsai |
| 2017/0055349 | A1 | 2/2017 | Chang et al. |
| 2019/0172781 | A1 | 6/2019 | Lee et al. |
| 2019/0246502 | A1 | 8/2019 | Ogawa |
| 2020/0053887 | A1 | 2/2020 | Bund |
| 2020/0144234 | A1 | 5/2020 | Jeon et al. |
| 2021/0307172 | A1 | 9/2021 | Darmawikarta et al. |

FOREIGN PATENT DOCUMENTS

| | | | |
|---|---|---|---|
| JP | 2006-0190983 | | 7/2006 |
| JP | 2006-0228856 | | 8/2006 |
| JP | 4669305 | B2 | 4/2011 |
| JP | 2011-155278 | A | 8/2011 |
| JP | 2012-164952 | | 8/2012 |
| JP | 2013-247216 | A | 12/2013 |
| JP | 2014-0510406 | | 4/2014 |
| JP | 2016-86024 | | 5/2016 |
| JP | 2019-087722 | | 6/2019 |
| JP | 2019-121626 | | 7/2019 |
| JP | 2019-134138 | | 8/2019 |
| KR | 10-0659510 | | 12/2006 |
| KR | 10-2008-0046275 | | 5/2008 |
| KR | 10-2014-0128058 | | 11/2014 |
| KR | 10-1613525 | | 4/2016 |
| KR | 10-2016-0118781 | A | 10/2016 |
| KR | 10-1726568 | | 4/2017 |
| KR | 10-1912290 | | 10/2018 |
| WO | WO 2018/044326 | | 3/2018 |

OTHER PUBLICATIONS

Chinese Office Action dated Aug. 24, 2023 issued in Application No. 202080073737.X.

Korean Office Action dated Feb. 28, 2024 issued in Application 10-2019-0130455.

U.S. Office Action dated Jan. 5, 2024 issued in U.S. Appl. No. 17/770,757.

Japanese Office Action dated Oct. 29, 2024 issued in Application No. 2022-523716.

Korean Office Action dated Apr. 10, 2025, issued in Application No. 10-2024-0127169.

Japanese Office Action dated Aug. 4, 2026, issued in Application No. 2025-086443.

【FIG. 1】
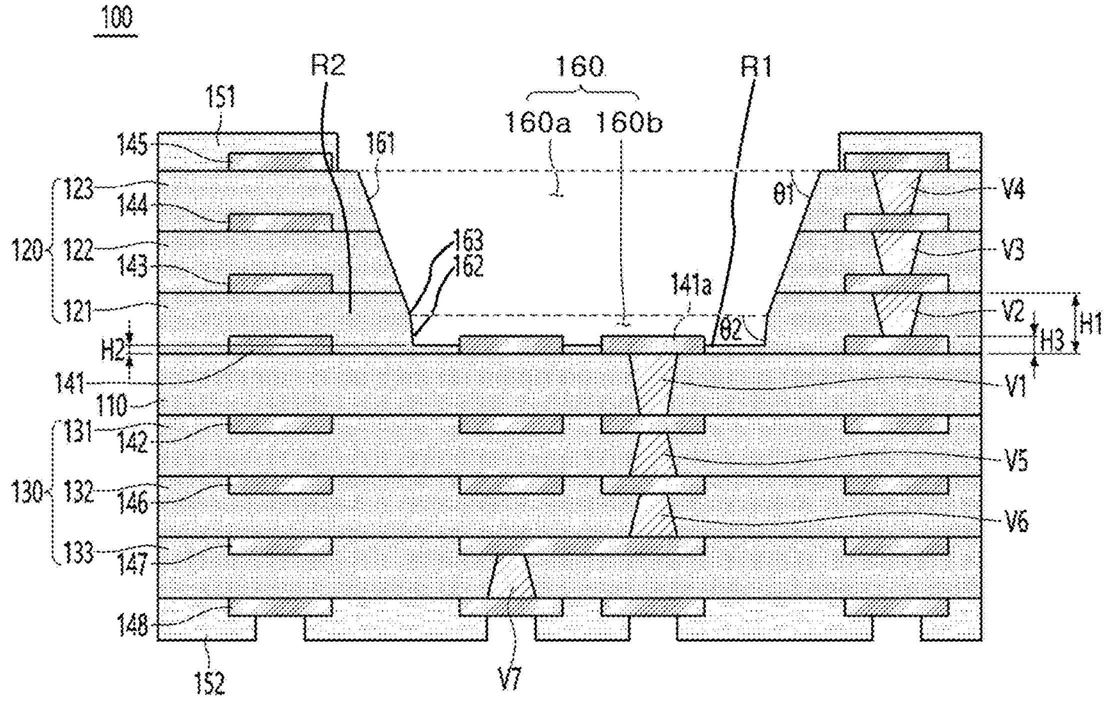

【FIG. 2】
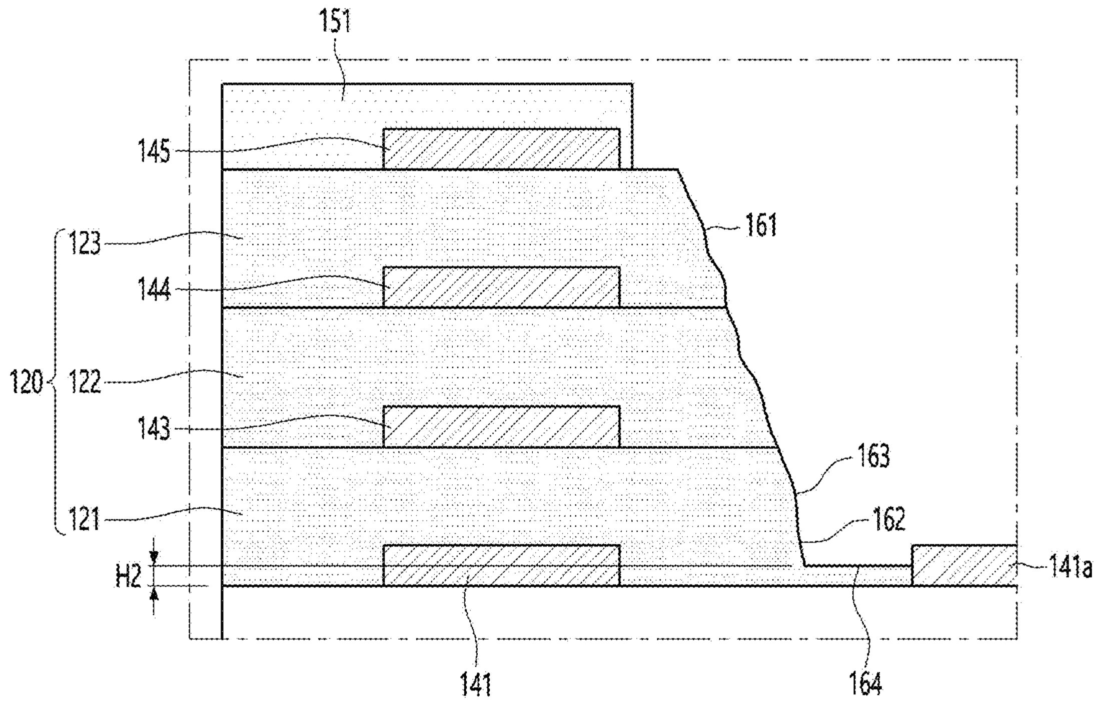

【FIG. 3】
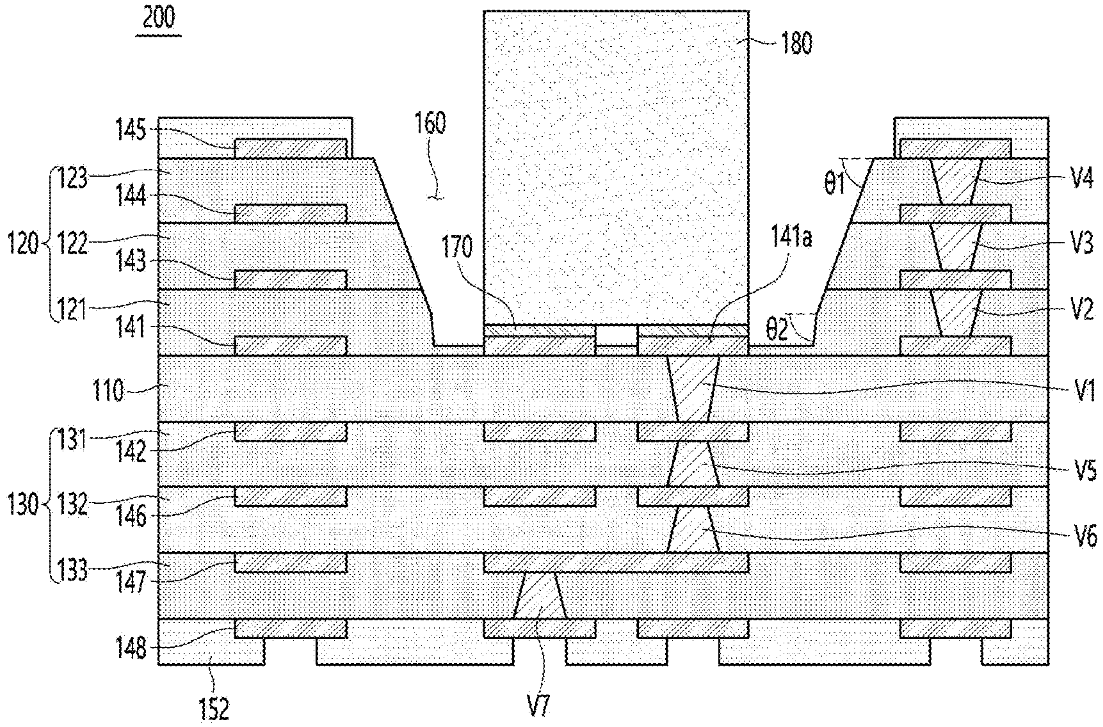

【FIG. 4】
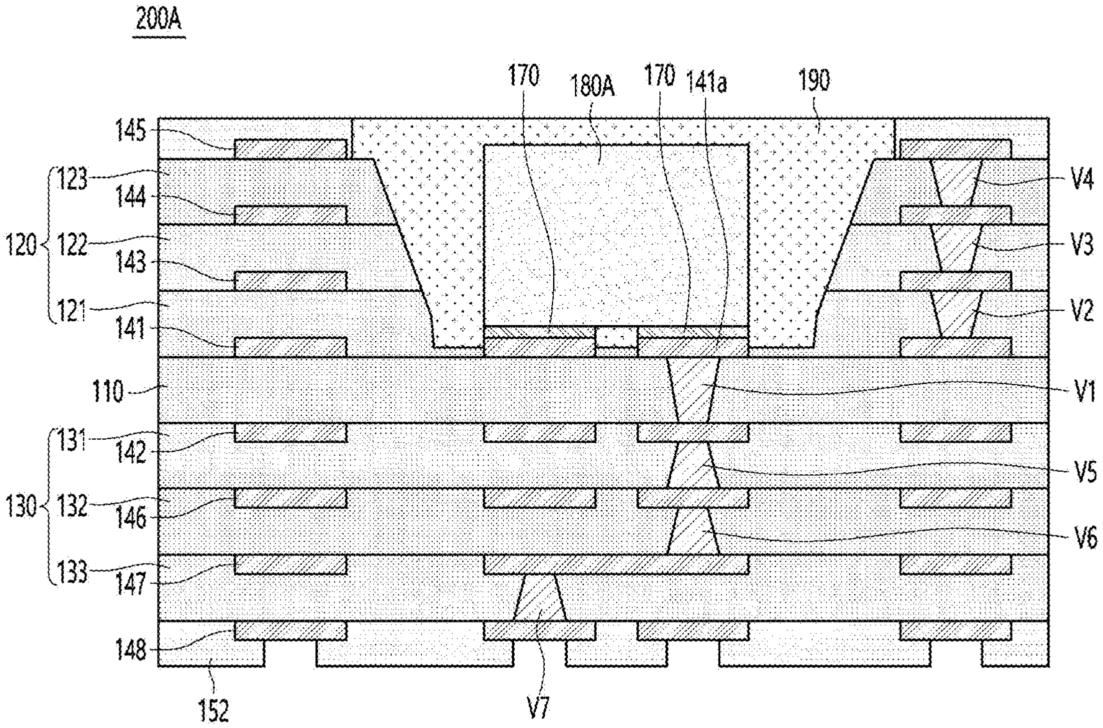
【FIG. 5】
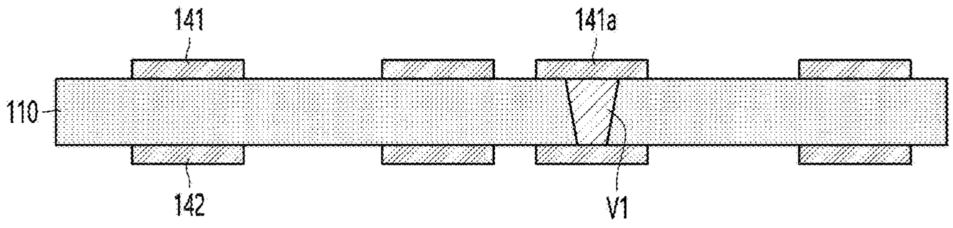

【FIG. 6】
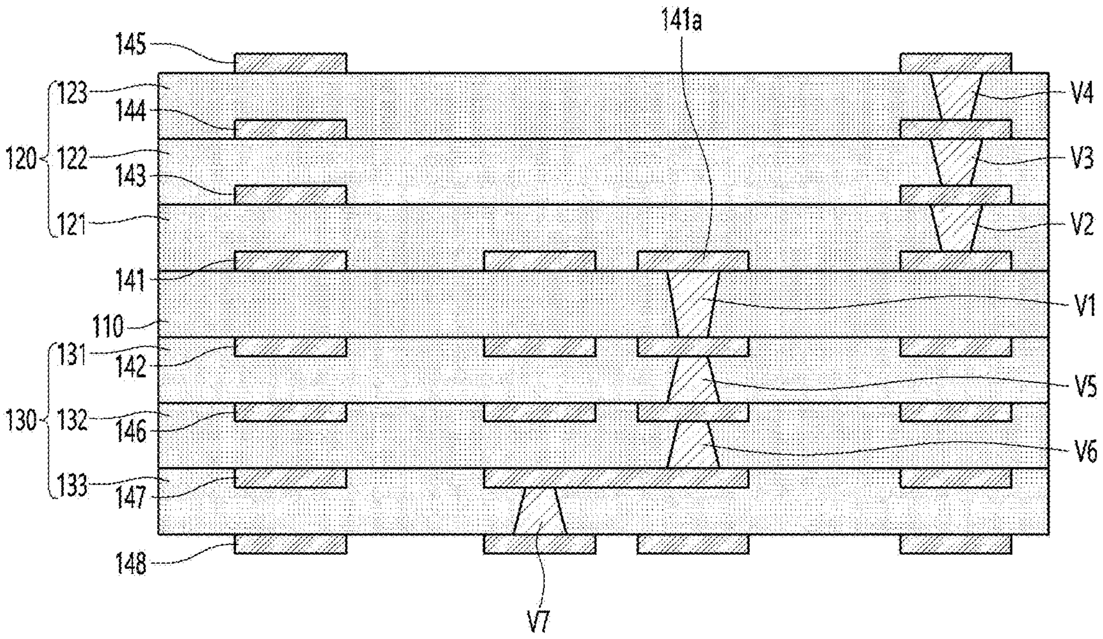

【FIG. 7】
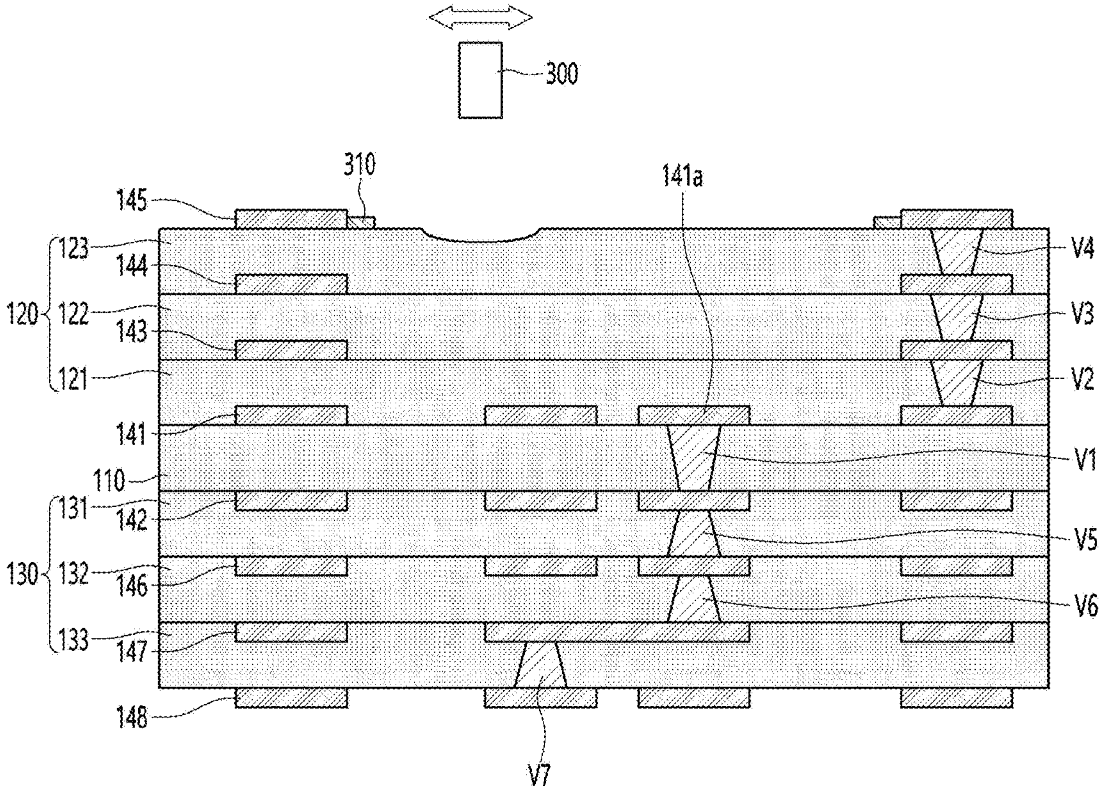

【FIG. 8】
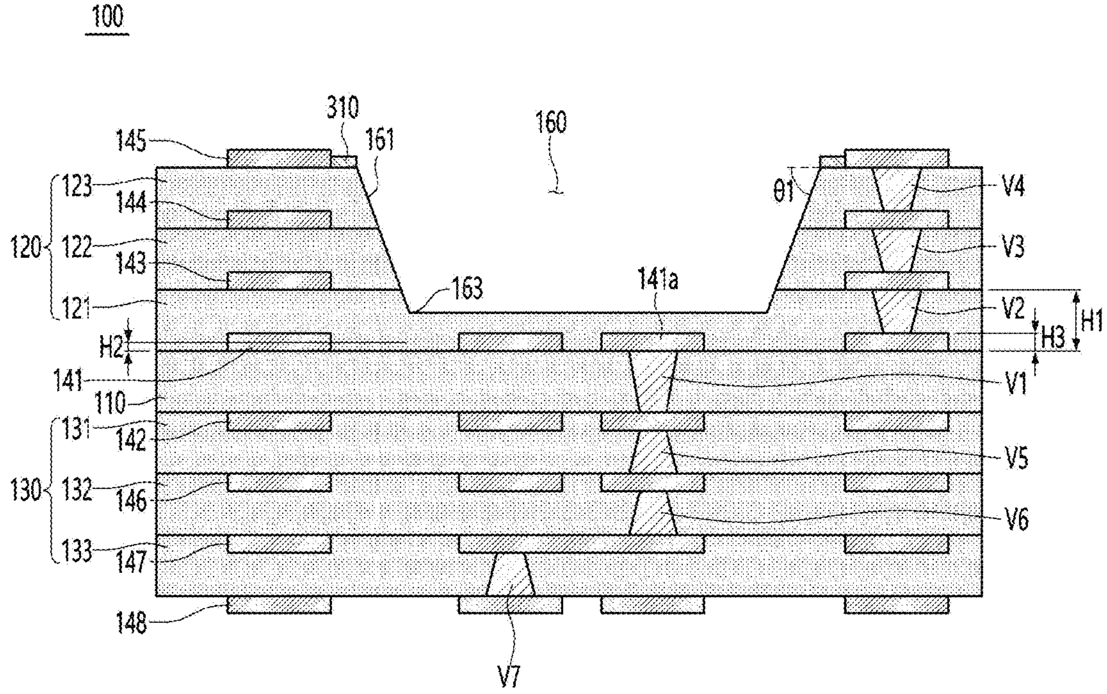

【FIG. 9】
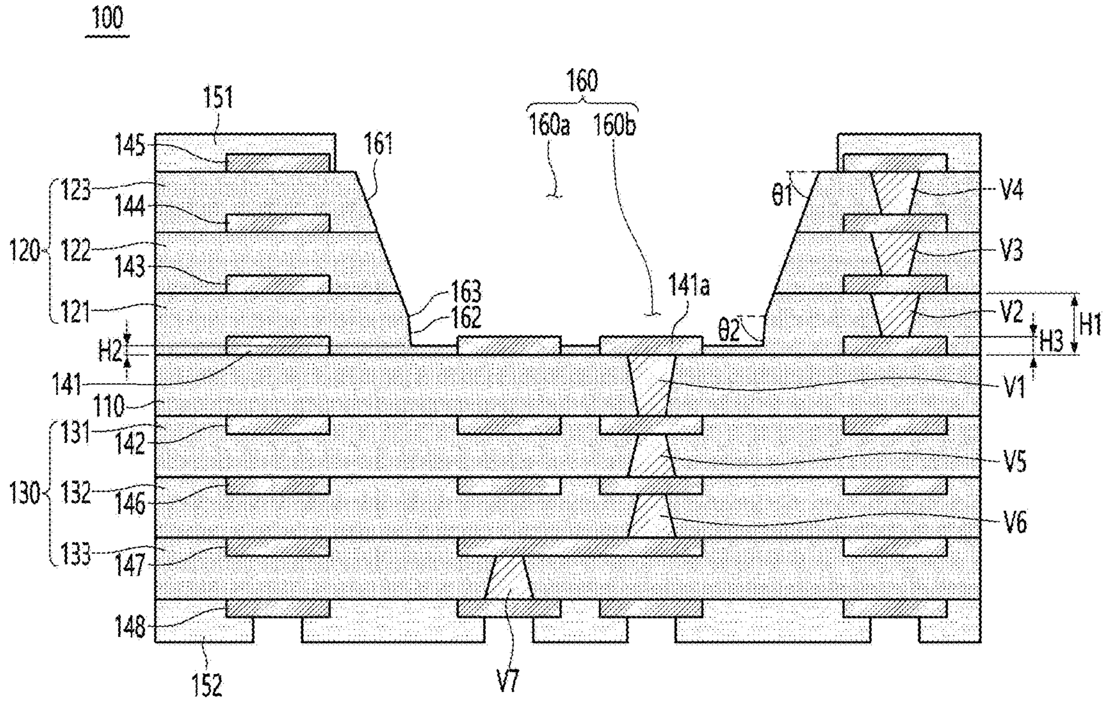

【FIG. 10】
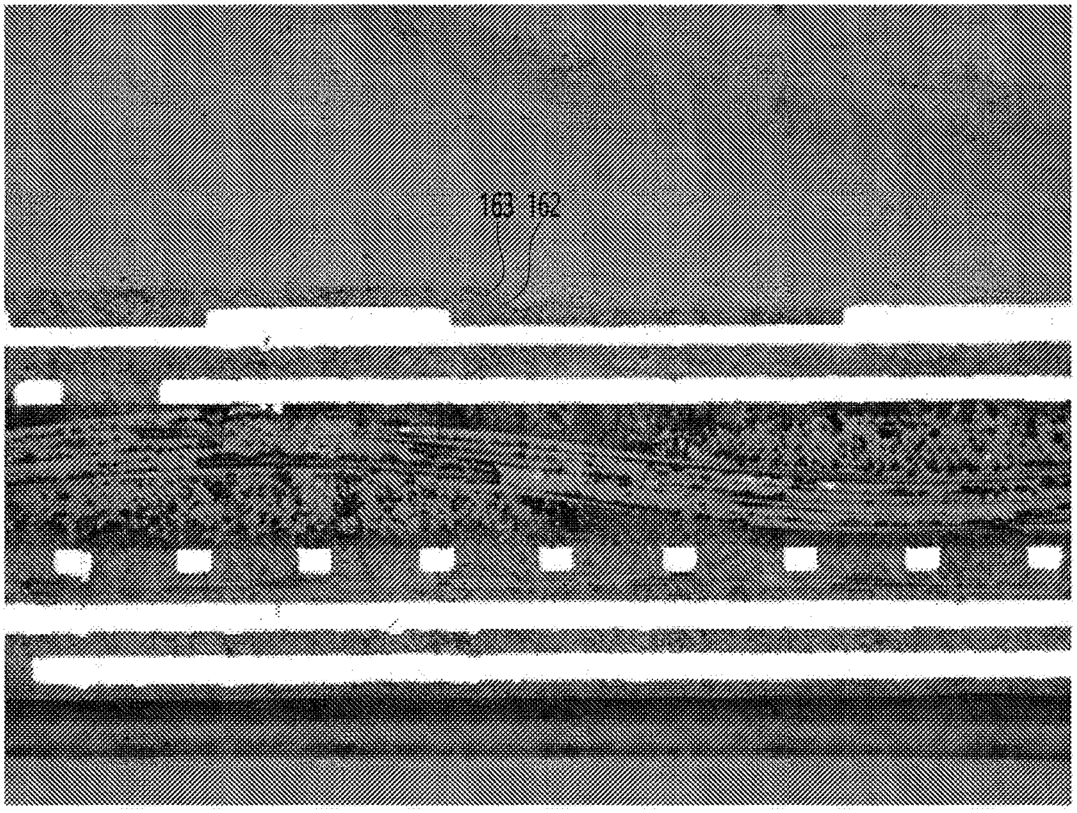

PRINTED CIRCUIT BOARD

CROSS-REFERENCE TO RELATED PATENT APPLICATIONS

This application is a continuation of U.S. patent application Ser. No. 17/770,757, filed Apr. 21, 2022, which is a U.S. National Stage Application under 35 U.S.C. § 371 of PCT Application No. PCT/KR2020/014386, filed Oct. 21, 2020, which claims priority to Korean Patent Application No. 10-2019-0130455, filed Oct. 21, 2019, whose entire disclosures are hereby incorporated by reference.

TECHNICAL FIELD

An embodiment relates to a printed circuit board.

BACKGROUND ART

A printed circuit board (PCB) is a board in which a printed circuit is printed with a conductive material on an electrically insulating substrate.

The printed circuit board has a structure in which the mounting position of each device is determined and a circuit pattern connecting the elements is printed on a flat surface to be fixed, or an embedded structure in which the device is embedded in the printed circuit board, in order to densely mount various types of devices on a flat plate.

Recently, the printed circuit board is used in a multi-layered structure capable of high-density integration in order to realize miniaturization and multifunctionality of electronic devices.

Generally, a conventional embedded printed circuit board forms a cavity for embedding a device using a drill bit, or uses auxiliary materials such as release films for mounting devices, or forms a cavity for embedding a device using a sand blast.

However, the conventional embedded printed circuit board has been difficult to achieve high-density integration due to the tolerance of the portion and depth of a processing region when the drill bit is used as described above, and thus a protective layer that was finally removed has to be formed.

In addition, the conventional embedded printed circuit board has difficulty in forming a cavity of a desired depth when sand blasting is used as described above, and thus a stop layer has to be formed.

In addition, manual work must be done in order to use subsidiary materials such as release film, and accordingly, there is a problem in that it is not easy to reduce the size of the cavity and increase the manufacturing cost.

On the other hand, when the protective layer or the stop layer is used, a process of removing it must be performed inevitably after the cavity is formed, and accordingly, there is a problem in that the process becomes complicated. In addition, the protective layer or the stop layer is formed of a metal, and thus the protective layer or the stop layer is removed by performing an etching process.

However, the protective layer or stop layer must have a thickness of at least 3 to 10 μm for the sand blast or laser process, and accordingly there is a problem in that a part of the pad exposed through the cavity is also removed when the protective layer or the stop layer is removed.

DISCLOSURE

Technical Problem

An embodiment provides a printed circuit board, a package substrate, and a method for manufacturing the same having a new structure.

In addition, the embodiment provides a printed circuit board, a package substrate, and a method of manufacturing the same, which can solve the reliability problem of the printed circuit board by forming a cavity through a plurality of processes.

In addition, the embodiment provides a printed circuit board, a package substrate, and a method of manufacturing the same, which can improve adhesion with a molding layer to be laminated later by allowing a portion of the insulating layer including the cavity to remain on the surface with roughness.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A printed circuit board according to an embodiment includes a first insulating layer, a second insulating layer disposed on the first insulating layer and including a cavity; and a pad disposed on the first insulating layer and having an upper surface exposed through the cavity; wherein the cavity includes a first part including a first inner wall; and a second part including a second inner wall under the first part; and wherein an inclination angle of the first inner wall is different from an inclination angle of the second inner wall.

In addition, the cavity includes an inflection point between the first inner wall and the second inner wall.

In addition, the inflection point is positioned higher than the upper surface of the pad.

In addition, the inclination angle of the first inner wall is smaller than the inclination angle of the second inner wall.

In addition, the inclination angle of the first inner wall has a range between 50° and 60°, and the inclination angle of the second inner wall has a range between 60° and 80°.

In addition, the second insulating layer includes: a first portion disposed on an upper surface of the first insulating layer in a region where the cavity is formed; and a second portion other than the first portion, and wherein a thickness of the first portion is smaller than a thickness of the second portion.

In addition, an upper surface of the first portion of the second insulating layer is positioned lower than the upper surface of the pad.

In addition, an upper width of the first part of the cavity is greater than a lower width of the second part of the cavity.

In addition, the cavity includes a bottom surface connected to the second inner wall and positioned higher than an upper surface of the first insulating layer.

In addition, the first inner wall, the second inner wall and the bottom surface have a surface curvature.

In addition, the surface curvature of the first inner wall is different from the surface curvature of at least one of the second inner wall and the bottom surface.

On the other hand, a package substrate according to an embodiment includes a first insulating layer; a second insulating layer disposed on the first insulating layer and including a cavity; a pad disposed on the first insulating layer and having an upper surface exposed through the cavity; a connection portion disposed on the pad; and an electronic device disposed on the connection portion, wherein the cavity includes: a first part including a first inner wall; and a second part under the first part including a second inner wall connected to the first inner wall and a bottom surface connected to the second inner wall, wherein the first inner wall, each of the second inner wall and the bottom surface has a surface curvature, and the surface curvature of the first inner wall is different from the surface curvature of at least one of the second inner wall and the bottom surface.

In addition, the cavity includes an inflection point positioned higher than an upper surface of the pad between the first inner wall and the second inner wall, and an inclination angle of the first inner wall with respect to the inflection point is smaller than an inclination angle of the second inner wall.

In addition, the package substrate further includes a molding layer disposed in the cavity and covering at least a portion of the electronic device, wherein the molding layer is in contact with the first inner wall, the second inner wall and the bottom surface.

On the other hand, a method of manufacturing a printed circuit board according to an embodiment includes preparing a first insulating layer, and forming a pad on the upper surface of the first insulating layer; forming a second insulating layer covering the pad on an upper surface of the first insulating layer; forming a mask having an opening on the second insulating layer; performing a laser process through the opening of the mask to form a first part of a cavity opening a part of the second insulating layer; and performing a plasma process on the second insulating layer under the first part to form a second part of the cavity exposing the upper surface of the pad while partially opening the second insulating layer, wherein an upper surface of the pad is covered by the second insulating layer before forming the second part.

In addition, the first part includes a first inner wall having a first inclination angle, and the second part includes a second inner wall having a second inclination angle different from the first inclination angle.

In addition, the second part includes a bottom surface connected to the second inner wall and positioned higher than an upper surface of the first insulating layer, and the first inner wall, the second inner wall and the bottom surface have a surface curvature, and the surface curvature of the first inner wall is different from the surface curvature of at least one of the second inner wall and the bottom surface.

Effects of the Invention

The printed circuit board of the embodiment includes a cavity. In this case, the cavity 160 has a non-penetrating structure rather than a penetrating structure through the second insulating layer 120. In this case, the cavity 160 exposes the pad 141*a* disposed on the first insulating layer 110. In addition, the bottom surface of the cavity 160 is positioned lower than the upper surface of the pad 141*a*. Accordingly, the embodiment does not need to form an additional layer to form the cavity 160, and accordingly, the number of processes can be reduced. In addition, the embodiment can solve a loss due to a change in the thickness or shape of the pad 141*a* that occurs in the process of removing the additional layer, and accordingly, product reliability may be improved.

In addition, the first part of the cavity of the embodiment is formed through a laser process, and the remaining second part of the cavity is formed through a plasma process after the laser process. Accordingly, it is possible to shorten the overall process time for forming the cavity by forming the first part through the laser process, and it is possible to secure a precise space by forming the second part through a plasma process.

In addition, the cavity 160 of the printed circuit board of the embodiment includes a first inner wall 161 having a first inclination angle with respect to the inflection point 163, a second inner wall 162 having a second inclination angle, and a bottom surface 164 extending from the second inner wall 163. In this case, the first inner wall 161, the second inner wall 162, and the bottom surface 164 of the cavity of the cavity 160 may not be flat and may have a predetermined surface roughness. In addition, an electronic device may be mounted on the pad 141*a* in the cavity 160. In addition, the molding layer 190 may be disposed in the cavity 160 to cover the electronic device. At this time, the inner wall and the bottom surface 164 of the cavity 160 have a certain surface roughness, so that a surface area in contact with the molding layer 190 can be increased, and accordingly, bonding strength may be improved during molding of the molding layer 190.

DESCRIPTION OF DRAWINGS

FIG. 1 is a view showing a printed circuit board according to an embodiment.

FIG. 2 is an enlarged view of a cavity region of FIG. 1.

FIG. 3 is a view showing a package substrate according to a first embodiment.

FIG. 4 is a view showing a package substrate according to a second embodiment.

FIGS. 5 to 9 are views showing a method of manufacturing the printed circuit board shown in FIG. 1 in order of process.

FIG. 10 is an enlarged photomicrograph of a cavity of a printed circuit board according to an embodiment.

BEST MODE

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, the terms such as first, second, A, B, (a), and (b) may be used in describing the elements of the embodiments of the present invention.

These terms are only used to distinguish the elements from other elements, and the terms are not limited to the essence, order, or order of the elements. In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

Hereinafter, embodiments of the present invention will be described in detail with reference to the accompanying drawings.

FIG. 1 is a view showing a printed circuit board according to an embodiment, and FIG. 2 is an enlarged view of a cavity region of FIG. 1.

Referring to FIGS. 1 and 2, the printed circuit board 100 includes a first insulating layer 110, a second insulating layer 120, a third insulating layer 130, circuit patterns 141, 142, 143, 144, 145, 146, 147, 148, vias V1, V2, V3, V4, V5, V6, V7, and protective layers 151 and 152.

The first insulating layer 110 may be an insulating layer disposed in a center of the printed circuit board 100.

The second insulating layer 120 is disposed on the first insulating layer 110.

In addition, the third insulating layer 130 is disposed under the first insulating layer 110.

At this time, although the first insulating layer 110 is illustrated as being disposed at the center layer in an entire stacked structure of the printed circuit board 100 in the drawing, the embodiment is not limited thereto. That is, the first insulating layer 110 may be disposed at a position biased toward an upper side in the entire stacked structure of the printed circuit board 100 or, conversely, may be disposed at a position biased toward a lower side.

The second insulating layer 120 is disposed on the first insulating layer 110. In this case, the second insulating layer 120 has a plurality of layer structures. For example, the second insulating layer 120 may include a second-first insulating layer 121 disposed on an upper surface of the first insulating layer 110, a second-second insulating layer 122 disposed on an upper surface of the second-first insulating layer 121, and a second-third insulating layer 123 disposed on an upper surface of the second-second insulating layer 122. At this time, although it is illustrated that the second insulating layer 120 has a three-layer structure in the drawings, the embodiment is not limited thereto. That is, the second insulating layer 120 may be configured of two or less layers, or alternatively, it may be configured with a structure of four or more layers.

In addition, the third insulating layer 130 is disposed under the first insulating layer 110. In this case, the third insulating layer 130 has a plurality of layer structures. For example, the third insulating layer 130 may include a third-first insulating layer 131 disposed under a lower surface of the first insulating layer 110, a third-second insulating layer 132 disposed under a lower surface of the third-first insulating layer 131, and a third-third insulating layer 132 disposed under a lower surface of the third-second insulating layer 132. At this time, although it is illustrated that the third insulating layer 130 has a three-layer structure in the drawings, the embodiment is not limited thereto. That is, the second insulating layer 130 may be configured with two or less layers, or alternatively, it may be configured with a structure of four or more layers.

In addition, although the printed circuit board 100 is illustrated as having a seven-layer structure based on the insulating layer in the drawings, the embodiment is not limited thereto. For example, the printed circuit board 100 may have a number of layers of 6 or less based on the insulating layer, or alternatively, may have a number of layers of 8 or more.

The first insulating layer 110, the second insulating layer 120, and the third insulating layer 130 are substrates on which an electric circuit capable of changing wiring is formed, and may include a printed circuit board and an insulating substrate made of an insulating material capable of forming circuit patterns on the surface thereof.

For example, at least one of the first insulating layer 110, the second insulating layer 120, and the third insulating layer 130 may be rigid or flexible. For example, at least one of the first insulating layer 110, the second insulating layer 120, and the third insulating layer 130 may include glass or plastic. In detail, at least one of the first insulating layer 110, the second insulating layer 120, and the third insulating layer 130 may include chemically strengthened/semi-tempered glass such as soda lime glass or aluminosilicate glass, or a reinforced or flexible plastic such as polyimide (PI), polyethylene terephthalate (PET), propylene glycol (PPG), polycarbonate (PC), or sapphire.

In addition, at least one of the first insulating layer 110, the second insulating layer 120, and the third insulating layer 130 may include an optical isotropic film. For example, at least one of the first insulating layer 110, the second insulating layer 120, and the third insulating layer 130 may include a cyclic olefin copolymer (COC), a cyclic olefin polymer (COP), an optical isotropic polycarbonate (PC) or an optical isotropic polymethyl methacrylate (PMMA).

Meanwhile, the second-first insulating layer 121 of a lowermost layer of the second insulating layer 120 may be an insulating layer that does not include glass fibers. Preferably, the second-first insulating layer 121 may be any one of resin coated copper (RCC), PPG (PREPER; Glass Fabric) and Akinomoto build-up film (ABF). In this case, a part of the second-first insulating layer 121 may be removed by a plasma process. At this time, when glass fibers are included in the second-first insulating layer 121, the plasma process may be affected, and accordingly, the second-first insulating layer 121 may include an insulating material that does not include glass fibers.

Circuit patterns may be disposed on surfaces of the first insulating layer 110, the second insulating layer 120, and the third insulating layer 130.

For example, the first circuit pattern 141 may be disposed on the upper surface of the first insulating layer 110. In this case, a plurality of first circuit patterns 141 may be disposed on the upper surface of the first insulating layer 110 while being spaced apart from each other by a predetermined interval.

A second circuit pattern 142 may be disposed on a lower surface of the first insulating layer 110. A plurality of second circuit patterns 142 may be disposed on the lower surface of the first insulating layer 110 while being spaced apart from each other by a predetermined distance.

Also, circuit patterns may be disposed on the surface of the second insulating layer 120. For example, a plurality of third circuit patterns 143 may be disposed on the upper surface of the second-first insulating layer 121 while being spaced apart from each other by a predetermined interval. Also, a plurality of fourth circuit patterns 144 may be disposed on the upper surface of the second-second insulating layer 122 while being spaced apart from each other by a predetermined distance. In addition, a plurality of fifth circuit patterns 145 may be disposed on the upper surface of the second-third insulating layer 123 while being spaced apart from each other by a predetermined interval.

Also, circuit patterns may be disposed on the surface of the third insulating layer 130. For example, a plurality of sixth circuit patterns 146 may be disposed on the lower surface of the third-first insulating layer 131 while being spaced apart from each other by a predetermined interval. Also, a plurality of seventh circuit patterns 147 may be disposed on a lower surface of the third-second insulating layer 132 while being spaced apart from each other by a predetermined interval. In addition, a plurality of eighth circuit patterns 148 may be disposed on the lower surface of the third-third insulating layer 133 while being spaced apart from each other by a predetermined interval.

Meanwhile, the first to eighth circuit patterns 141, 142, 143, 144, 145, 146, 147, and 148 as described above are wirings that transmit electrical signals, and may be formed of a metal material having high electrical conductivity. To this end, the first to eighth circuit patterns 141, 142, 143, 144, 145, 146, 147, and 148 may be formed of at least one metal material selected from gold (Au), silver (Ag), platinum (Pt), titanium (Ti), tin (Sn), copper (Cu), and zinc (Zn). In addition, the first to eighth circuit patterns 141, 142, 143, 144, 145, 146, 147 and 148 may be formed of a paste or solder paste including at least one metal material selected from gold (Au), silver (Ag), platinum (Pt), titanium (Ti), tin (Sn), copper (Cu), and zinc (Zn). Preferably, the first to eighth circuit patterns 141, 142, 143, 144, 145, 146, 147, and 148 may be formed of copper (Cu), which has high electrical conductivity and is relatively inexpensive.

The first to eighth circuit patterns 141, 142, 143, 144, 145, 146, 147, and 148 may be formed using an additive process, a subtractive process, a modified semi additive process (MSAP), and a semi additive process (SAP), which are typical printed circuit board manufacturing processes, and a detailed description will be omitted here.

Meanwhile, the first circuit pattern 141 may include a pad 141*a* that is exposed through the cavity 160 while being disposed on the upper surface of the first insulating layer 110. The pad 141*a* may be electrically connected to an electronic device (described later) mounted in the cavity 160. For example, the pad 141*a* may be a wire bonding pad connected to an electronic device mounted in the cavity 160 through a wire. Alternatively, the pad 141*a* may be a flip-chip bonding pad directly connected to a terminal of an electronic device mounted in the cavity 160. This will be described in more detail below.

Meanwhile, each of the first to eighth circuit patterns 141, 142, 143, 144, 145, 146, 147, and 148 may include a pattern connected to a via for interlayer conduction, a pattern for signal transmission, and a pad connected to an electronic device and the like.

Vias V1, V2, V3, V4, V5, V6, and V7 are disposed in the first insulating layer 110, the second insulating layer 120 and the third insulating layer 130, and may electrically connect circuit patterns disposed on different layers to each other. The vias V1, V2, V3, V4, V5, V6, and V7 may be disposed to pass through at least one of the first insulating layer 110, the second insulating layer 120, and the third insulating layer 130. In addition, both ends of the vias V1, V2, V3, V4, V5, V6, and V7 are respectively connected to circuit patterns disposed on different insulating layers, and thus an electrical signal may be transmitted.

A first via V1 may be disposed in the first insulating layer 110. The first via V1 may be disposed to pass through upper and lower surfaces of the first insulating layer 110. The first via V1 may electrically connect the first circuit pattern 141 disposed on the upper surface of the first insulating layer 110 and the second circuit pattern 142 disposed on the lower surface of the first insulating layer.

A plurality of vias may be disposed in the second insulating layer 120. That is, the second via V2 may be disposed in the second-first insulating layer 121. The second via V2 may electrically connect the first circuit pattern 141 disposed on the upper surface of the first insulating layer 110 and the third circuit pattern 143 disposed on the upper surface of the second-first insulating layer 121.

In addition, a third via V3 may be disposed in the second-second insulating layer 122. The third via V3 may electrically connect the fourth circuit pattern 144 disposed on the upper surface of the second-second insulating layer 122 and the third circuit pattern 143 disposed on the upper surface of the second-first insulating layer 121.

In addition, a fourth via V4 may be disposed in the second-third insulating layer 123. The fourth via V4 may electrically connect the fifth circuit pattern 145 disposed on the upper surface of the second-third insulating layer 123 and the fourth circuit pattern 144 disposed on the upper surface of the second-second insulating layer 122.

A plurality of vias may be disposed in the third insulating layer 130. That is, a fifth via V5 may be disposed in the third-first insulating layer 131. The fifth via V5 may electrically connect the second circuit pattern 142 disposed on a lower surface of the first insulating layer 110 and the sixth circuit pattern 146 disposed on a lower surface of the third-first insulating layer 131.

In addition, a sixth via V6 may be disposed in the third-second insulating layer 132. The sixth via V6 may electrically connect the seventh circuit pattern 147 disposed on the lower surface of the third-second insulating layer 132 and the sixth circuit pattern 146 disposed on the lower surface of the third-first insulating layer 131.

In addition, a seventh via V7 may be disposed in the third-third insulating layer 133. The seventh via V7 may electrically connect the eighth circuit pattern 148 disposed on a lower surface of the third-third insulating layer 133 and the seventh circuit pattern 147 disposed on a lower surface of the third-second insulating layer 132.

Meanwhile, the vias V1, V2, V3, V4, V5, V6, and V7 may be disposed to pass through only one insulating layer among the first insulating layer 110, the second insulating layer 120, and the third insulating layer 130, and alternatively, may be disposed to pass through the plurality of insulating layers in common. Accordingly, the vias V1, V2, V3, V4, V5, V6, and V7 may connect circuit patterns disposed on the surface of the insulating layer that are at least two or more apart from each other, rather than the neighboring insulating layers.

Meanwhile, the vias V1, V2, V3, V4, V5, V6, and V7 may be formed by filling the inside of a through hole (not shown) penetrating at least one insulating layer among the plurality of insulating layers with a conductive material.

The through hole may be formed by any one of machining methods, including mechanical, laser, and chemical machining. When the through hole is formed by machining, methods such as milling, drilling, and routing can be used, and when the through hole is formed by laser processing, a UV or $CO_2$ laser method can be used, and when the through hole is formed by chemical processing, drugs including aminosilanes, ketones, etc. may be used, and accordingly, at least one insulating layer among the plurality of insulating layers may be opened.

On the other hand, the processing by the laser is a cutting method in which optical energy is concentrated on the surface to melt and evaporate a part of the material to take a desired shape, and it can easily process complex formations by computer programs, and can process composite materials that are difficult to cut by other methods.

In addition, the processing by the laser can have a cutting diameter of at least 0.005 mm, and has a wide advantage in a range of possible thicknesses.

As the laser processing drill, it is preferable to use a YAG (Yttrium Aluminum Garnet) laser, a $CO_2$ laser, or an ultraviolet (UV) laser. The YAG laser is a laser that can process both the copper foil layer and the insulating layer, and the $CO_2$ laser is a laser that can process only the insulating layer.

When the through hole is formed, the vias V1, V2, V3, V4, V5, V6, and V7 may be formed by filling the inside of the through hole with a conductive material. Metal materials forming the vias V1, V2, V3, V4, V5, V6, and V7 may be any one material selected from copper (Cu), silver (Ag), tin (Sn), gold (Au), nickel (Ni) and palladium (Pd), and the conductive material may be filled by any one of electroless plating, electrolytic plating, screen printing, sputtering, evaporation, ink-jetting, and dispensing.

Meanwhile, protective layers 151 and 152 may be disposed on surfaces of outermost insulating layers among the first insulating layer 110, the second insulating layer 120, and the third insulating layer 130. For example, the first protective layer 151 may be disposed on an upper surface of an uppermost insulating layer among the plurality of insulating layers. For example, the first protective layer 151 may be disposed on an upper surface of the second-third insulating layer 123 which is the uppermost insulating layer among the second insulating layer 120. In addition, a second protective layer 152 may be disposed on a lower surface of a lowermost insulating layer among the plurality of insulating layers. For example, the second protective layer 152 may be disposed on a lower surface of the third-third insulating layer 133 which is the lowermost insulating layer among the third insulating layer 130.

The first protective layer 151 and the second protective layer 152 may each have an opening. For example, the first protective layer 151 may have an opening exposing the surface of the fifth circuit pattern to be exposed among the fifth circuit patterns 145 disposed on the upper surface of the second-third insulating layer 123.

In addition, the second protective layer 152 may have an opening exposing the surface of the eighth circuit pattern to be exposed among the eighth circuit patterns 148 disposed on the lower surface of the third-third insulating layer 133.

The first protective layer 151 and the second protective layer 152 may include an insulating material. The first protective layer 151 and the second protective layer 152 may include various materials that can be cured by heating after being applied to protect the surface of the circuit patterns. The first protective layer 151 and the second protective layer 152 may be resist layers. For example, the first protective layer 151 and the second protective layer 152 may be a solder resist layer including an organic polymer material. For example, the first protective layer 151 and the second protective layer 152 may include an epoxy acrylate-based resin. In detail, the first protective layer 151 and the second protective layer 152 may include a resin, a curing agent, a photo initiator, a pigment, a solvent, a filler, an additive, an acryl-based monomer, and the like. However, the embodiment is not limited thereto, and the first protective layer 151 and the second protective layer 152 may be any one of a photo solder-resist layer, a cover-lay, and a polymer material.

A thickness of each of the first protective layer 151 and the second protective layer 152 may be 1 μm to 20 μm. The first protective layer 151 and the second protective layer 152 may have a thickness of 1 μm to 15 μm. For example, the thickness of the first protective layer 151 and the second protective layer 152 may be 5 μm to 20 μm. When the thickness of the first protective layer 151 and the second protective layer 152 is greater than 20 μm, the thickness of the printed circuit board 100 may increase. When the thickness of the first protective layer 151 and the second protective layer 152 is less than 1 μm, the reliability of circuit patterns included in the printed circuit board 100 may be deteriorated.

Meanwhile, a cavity 160 may be formed in the second insulating layer 120. In this case, the cavity 160 may be formed in the second insulating layer 120 composed of a plurality of layers. In this case, the cavity 160 may be disposed to pass through at least one insulating layer among the second insulating layers 120 composed of the plurality of layers, and may be non-passed through at least another insulating layer.

That is, a normal cavity 160 is disposed through the insulating layer. Accordingly, the insulating layer overlapping the cavity 160 in the horizontal direction does not exist at the position where the cavity 160 is to be disposed. For example, the cavity in a comparative example is disposed to penetrate the second insulating layer 120 as a whole. For example, the cavity in the comparative example is disposed to penetrate the lower surface of the second-first insulating layer 121 and the upper surface of the second-third insulating layer 123.

Unlike this, at least one insulating layer among the insulating layers vertically overlapping with the cavity 160 at a position where the cavity is to be disposed penetrates in the cavity of the embodiment, but does not penetrate at least another insulating layer.

That is, the cavity 160 in the embodiment is disposed in the second insulating layer 120. That is, the cavity 160 is disposed in the second-first insulating layer 121, the second-second insulating layer 122, and the second-third insulating layer 123.

In this case, the cavity in the structure of the printed circuit board of the comparative example is disposed to pass through all of the second-first insulating layer 121, the second-second insulating layer 122, and the second-third insulating layer 123. Accordingly, the upper surface of the first insulating layer in the region vertically overlapping with the cavity is exposed in the printed circuit board of the comparative example. That is, the second insulating layer (more specifically, the second-first insulating layer) does not exist on the upper surface of the first insulating layer vertically overlapping with the cavity in the printed circuit board of the comparative example.

In contrast, the cavity 160 in the printed circuit board 100 according to the embodiment penetrates the second-first insulating layer 121 and the second-second insulating layer 122, and does not penetrate the second-third insulating layer 123.

That is, the cavity 160 includes a first part disposed in the second-first insulating layer 121, a second part disposed in the second-second insulating layer 122, and a third part disposed in the second-third insulating layer 123. Here, as the second insulating layer 122 in the embodiment has a three-layer structure, the cavity 160 is illustrated as being composed of first to third parts, but the embodiment is not limited thereto. For example, when the second insulating layer 120 has a two-layer structure, the cavity 160 may include only the first and second parts. For example, when the second insulating layer 122 has a five-layer structure, the cavity 160 may include first to fifth parts. However, the cavity 160 in the embodiment is characterized in that the lowermost part has a groove shape rather than a through hole shape.

The first part may be disposed in the second-first insulating layer 121. In this case, the first part may be a groove disposed in the second-first insulating layer 121 and forming a lower region of the cavity 160.

The second part may be disposed in the second-second insulating layer 122. The second part may be disposed in the second-second insulating layer 122 and may be a through hole forming a central region of the cavity 160.

The third part may be disposed in the second-third insulating layer 123. The third part may be a through hole disposed in the second-third insulating layer 123 and forming an upper region of the cavity 160.

That is, the cavity 160 may be composed of a combination of the first part, the second part, and the third part. In this case, a thickness of the first part may be smaller than a thickness of the second-first insulating layer 121. Accordingly, the cavity 160 may be formed without penetrating the second-first insulating layer 121.

In other words, the second-first insulating layer 121 may include a first region R1 disposed on a region overlapping the cavity 160 in a vertical direction, and a second region R2 excluding the first region R1. In addition, a thickness of the first region R1 may be different from a thickness of the second region R2.

Preferably, the thickness H1 of the second region R2 may be the thickness of the second-first insulating layer 121.

The thickness H1 of the second region R2 may be 20 μm to 100 μm. For example, the thickness H1 of the second region R2 may be 25 μm to 50 μm. For example, the thickness H1 of the second region R2 may be 30 μm to 40 μm. When the thickness H1 of the second region R2 exceeds 100 μm, the overall thickness of the printed circuit board 100 may increase. When the thickness H1 of the second region R2 is less than 20 μm, the pad 141*a* or the first circuit pattern cannot be stably protected. In addition, when the thickness H1 of the second region R2 is less than 20 μm, the second-first insulating layer 121 may be vulnerable to heat/pressure or the like in the process of mounting an electronic device.

The thickness H2 of the first region R1 may be smaller than the thickness H1 of the second region. The thickness H2 of the first region R1 may be determined by a thickness H3 of the pad 141*a*. Preferably, the thickness H2 of the first region R1 may be smaller than the thickness H3 of the pad 141*a*.

Preferably, the thickness H3 of the pad 141*a* may be smaller than the thickness H1 of the second region R2. For example, the thickness H3 of the pad 141*a* may be 5 μm to 30 μm.

In addition, the thickness H2 of the first region R1 may be smaller than the thickness H3 of the pad 141*a*. For example, the thickness H2 of the first region R1 may be 3 μm to 25 μm. Accordingly, the first region R1 of the second-first insulating layer 121 is disposed on the first insulating layer 110. In this case, the first region R1 of the second-first insulating layer 121 may expose an upper surface of the pad 141*a* disposed on the first insulating layer 110.

The cavity 160 of the embodiment is not formed to pass through the second insulating layer 120 in order to mount an electronic device, but at least a part of the second insulating layer 120 (the first region of the second-first insulating layer 121) is formed in a remaining state on the first insulating layer 110.

In this case, the thickness H2 of the remaining part of the second insulating layer 120 is smaller than the thickness H3 of the pad 141*a* to be exposed on the cavity 160. Accordingly, the cavity 160 in an embodiment may be formed while maintaining the shape of the pad 141*a* without affecting the mounting of the electronic device on the pad 141*a*.

That is, the cavity forming process in the prior art was performed in a state in which a protective layer or a stop layer was disposed on the first insulating layer in order to form the cavity in the plurality of insulating layers as described above. Accordingly, the cavity in the prior art could be formed to a desired depth (a depth penetrating all of the second insulating layer). However, an etching process of removing the protective layer or the stop layer in the related art has to be performed after the cavity is formed. Accordingly, a part of the pad disposed on the first insulating layer in the related art is also removed during the etching process of removing the protective layer or the stop layer, and accordingly, a problem may occur in the reliability of the pad. At this time, the thickness of the protective layer or stop layer required for sand blasting or laser processing is 3 um to 10 um, and accordingly, there is a problem in that an amount corresponding to the thickness of the protective layer or the stop layer among the entire thickness of the pad is removed during the etching process.

Accordingly, the cavity in the embodiment can be easily formed in a state in which the protective layer or the stop layer is not formed, and thus, the reliability problem that occurs during the process of removing the protective layer or the stop layer is solved.

And, this allows the cavity 160 to be formed without penetrating the second-first insulating layer 121 by controlling process conditions for forming the cavity.

In this case, the cavity 160 may be formed by a plurality of processes.

That is, the cavity 160 may be divided into a first part formed by a first process and a second part formed by a second process.

The first part may be formed on an entire region of the second-third insulating layer 123, an entire region of the second-second insulating layer 122, and a partial region of the second-first insulating layer 121. The first process may be a laser process.

That is, when the cavity 160 is formed in the embodiment, the first part 160*a* of the cavity 160 may be formed by primarily removing the entire region of the second-third insulating layer 123, the entire region of the second-second insulating layer 122, and the partial region of the second-first insulating layer 121 through a laser process.

In this case, a first inner wall 161 of the first part 160*a* may have a first inclination angle θ1. Preferably, the first inclination angle θ1 may be 50° to 60°. The first inner wall 161 of the first part 160*a* may be a laser cut surface formed by a laser process.

The first part 160*a* may have a first depth. In this case, the first depth of the first part 160*a* may be greater than a second depth of the second part 160*b* formed by a plasma process based on the total thickness of the second insulating layer 120. The first depth of the first part 160*a* may be greater than ½ of the thickness of the second insulating layer 120.

A second part 160*b* may be formed under the first part 160*a*. The second part 160*b* may communicate with the first part 160*a*. For example, the second part 160*b* may be connected to the first part 160*a* to form a single cavity 160.

An inflection point 163 may be formed between the first inner wall 161 of the first part 160*a* and the second inner wall 162 of the second part 160*b*. The inflection point 163 may mean a portion at which the inclination angle of the inner walls 161 and 162 of the cavity 160 is changed. For example, the inflection point 163 may be a point where a lowermost end of the first inner wall 161 of the first part 160*a* and an uppermost end of the second inner wall 162 of the second part 160*b* meet.

That is, the first part 160*a* is formed by a laser process, and the second part 160*b* is formed by a plasma process, so that the inflection point 163 at which an inclination angle (or curvature) is changed may be positioned at a point where the first part 160*a* and the second part 160*b* meet.

In this case, the inflection point 163 may be positioned higher than the pad 141*a*. In other words, the lowermost end of the first part 160*a* may be positioned higher than the upper surface of the pad 141*a*. In other words, the uppermost end of the second part 160*b* may be positioned higher than the upper surface of the pad 141*a*.

That is, the first part 160*a* may be formed by a laser process up to a point higher than the upper surface of the pad 141*a*. In this case, when the first part 160*a* is formed up to the point where the pad 141*a* is positioned, the pad 141*a* may be damaged by the laser in the process of forming the first part 160*a*. Accordingly, the first part 160*a* in the embodiment can be formed only up to a point higher than the upper surface of the pad 141*a*.

In addition, the second part 160*b* may have a second depth and be formed under the first part 160*a*. The second depth may be smaller than the first depth of the first part 160*a*.

The second part 160*b* may include a second inner wall 162 connected to the first inner wall 161 and a bottom surface 164 connected to the second inner wall 162. The second inner wall 162 and the bottom surface 164 may be plasma-treated surfaces formed by a plasma process.

The bottom surface 164 may be positioned lower than the upper surface of the pad 141*a*. That is, when the bottom surface 164 is positioned higher than the pad 141*a*, a part of the upper surface of the pad 141*a* is covered by the second insulating layer, and this may affect product reliability. Accordingly, the bottom surface 164 in the embodiment is positioned lower than the upper surface of the pad 141*a*.

The second inner wall 162 of the second part 160*b* may have a second inclination angle θ2. In this case, the second inclination angle θ2 of the second inner wall 162 of the second part 160*b* may be different from the first inclination angle θ1 of the first inner wall 161 of the first part 160*a*. For example, the second inclination angle θ2 of the second inner wall 162 of the second part 160*b* may be greater than the first inclination angle θ1 of the first inner wall 161 of the first part 160*a*. For example, the second inclination angle θ2 may be 60° to 80°.

Meanwhile, the upper surface of the pad 141*a* covered by the second insulating layer 120 may be exposed in the process of forming the second part 160*b*. In this case, the second part 160*b* is formed by a plasma process, and accordingly, the second part 160*b* may be precisely formed without damage to the surface of the pad 141*a* in the process of forming the second part 160*b*.

As described above, a maximum depth of the cavity 160 including the first part 160*a* and the second part 160*b* may be smaller than the total thickness of the second insulating layer 120. Also, a minimum depth of the cavity 160 may be greater than a depth obtained by subtracting the thickness of the pad 141*a* from the total thickness of the second insulating layer 120. Accordingly, an upper surface of the first region R1 of the second-first insulating layer 121 of the second insulating layer 120 in the embodiment is higher than the upper surface of the first insulating layer 110 and lower than the upper surface of the pad 141*a*.

Meanwhile, referring to FIG. 2, the cavity 160 may include the first inner wall 161 of the first part 160*a*, the second inner wall 162 and the bottom surface 164 of the second part 160*b*.

In this case, the first inner wall 161 of the first part 160*a* and the second inner wall 162 and the bottom surface 164 of the second part 160*b* may have a predetermined surface roughness.

In this case, the surface roughness of the first inner wall 161 of the first part 160*a* may be different from the surface roughness of the second inner wall 162 of the second part 160*b*. For example, the surface roughness of the first inner wall 161 of the first part 160*a* may be greater than the surface roughness of the second inner wall 162 of the second part 160*b*. Also, the surface roughness of the second inner wall 162 of the second part 160*b* may be the same as the surface roughness of the bottom surface 164.

At this time, an additional process is not performed in the embodiment, so that the first inner wall 161 of the first part 160*a* of the cavity 160, the second inner wall 162 and the bottom surface 164 of the second part 160*b* have a predetermined surface roughness. That is, different surface roughness as described above may be formed during the laser process and the plasma process for forming the cavity 160 in the embodiment.

In other words, the bottom surface 164 of the cavity 160 may mean the upper surface of the first region R1 of the second-first insulating layer 121. In addition, a height of the upper surface of the first region R1 of the second-first insulating layer 121 is not constant and may have a deviation depending on a position.

Meanwhile, the first inner wall 161 of the first part 160*a* and the second inner wall 162 of the second part 160*b* may have a first inclination angle θ1 and a second inclination angle θ2 as described above.

In this case, the inner walls 161 and 162 may be curved having a certain surface roughness rather than a straight line. Accordingly, the first inclination angle θ1 may be an interior angle between a first virtual line connecting the uppermost end of the first part 160*a* and the lowermost end of the first part 160*a* and a second virtual lines corresponding to the upper surface of the second insulating layer 120.

In addition, the second inclination angle θ2 may be an interior angle between a third virtual line connecting between the uppermost end of the second part 160*b* and the lowermost end of the second part 160*b* and the second virtual lines corresponding to the upper surface of the second insulating layer 120.

FIG. 3 is a view showing a package substrate according to a first embodiment.

Referring to FIG. 4, the package substrate 200 in the embodiment includes the printed circuit board 100 shown in FIG. 1 and an electronic device 180 mounted in the cavity 160 of the printed circuit board 100.

The printed circuit board 100 described with reference to FIG. 1 may be used as a package substrate 200 for mounting the electronic device 180.

At this time, since the printed circuit board 100 has already been described in detail in FIG. 1, a description thereof will be omitted.

The printed circuit board 100 includes a cavity 160, and a pad 141*a* may be exposed in the cavity 160. In this case, the second-first insulating layer 121 may be disposed in the cavity 160 except for the region where the pad 141*a* is formed. However, the height of the first region R1 of the second-first insulating layer 121 is lower than the height of the pad 141*a*. Accordingly, the electronic device 180 may be stably mounted on the pad 141*a* without being affected by the second-first insulating layer 121 on the first region R1. In other words, when the height of the first region R1 of the second-first insulating layer 121 is higher than the height of the pad 141*a*, the electronic device 180 may be mounted on the pad 141*a* in an inclined state, and furthermore, a defect may occur in an electrical connection state with the pad 141*a*.

In this case, the electronic device 180 may be an electronic component disposed in the cavity 160 of the printed circuit board 100, and may be divided into an active device and a passive device. In addition, the active device is a device that actively uses a non-linear portion, and the passive device refers to a device that does not use the non-linear characteristic even though both linear and non-linear characteristics exist. In addition, the passive device may include a transistor, an IC semiconductor chip, and the like, and the passive device may include a capacitor, a resistor, an inductor, and the like. The passive device is mounted on a general printed circuit board to increase a signal processing speed of a semiconductor chip, which is an active device, or to perform a filtering function.

Meanwhile, a connection portion 170 may be disposed on the pad 141*a*. A planar shape of the connection portion 170 may be a quadrangle. The connection portion 170 is disposed on the pad 141*a* and electrically connects the electronic device 180 and the pad 141*a* while fixing the electronic device 180. To this end, the pad 141*a* may be formed of a conductive material. For example, the connection portion 170 may be a solder ball. The connection portion 170 may include a solder containing a material of a heterogeneous component. The solder may be formed of at least one of SnCu, SnPb, and SnAgCu. In addition, the heterogeneous material may include any one of Al, Sb, Bi, Cu, Ni, In, Pb, Ag, Sn, Zn, Ga, Cd, and Fe.

Meanwhile, an upper surface of the electronic device 180 may be positioned higher than the surface of the uppermost layer of the printed circuit board 100. However, the embodiment is not limited thereto, and the upper surface of the electronic device 180 may be disposed at the same height as the surface of the uppermost layer of the printed circuit board 100 depending on the type of the electronic device 180, or may be disposed lower than this.

FIG. 4 is a view showing a package substrate according to a second embodiment.

Referring to FIG. 4, the package substrate 200A in the embodiment includes the printed circuit board 100 shown in FIG. 1 and an electronic device 180*a* mounted in the cavity 160 of the printed circuit board 100.

In addition, the package substrate 200A is disposed in the cavity 160 and further includes a molding layer 190 covering the electronic device 180*a*.

The molding layer 190 may be selectively disposed in the cavity 160 to protect the electronic device 180*a* mounted in the cavity 160.

The molding layer 190 may be formed of a molding resin, for example, EMC (Epoxy Molding Compound). However, the embodiment is not limited thereto, and the molding layer 190 may be formed of various resins for molding other than EMC.

The printed circuit board 100 described with reference to FIG. 1 may be used as a package substrate 200A for mounting the electronic device 180*a*.

The printed circuit board 100 includes a cavity 160, and a pad 141*a* may be exposed in the cavity 160. In this case, the second-first insulating layer 121 may be disposed in the cavity 160 except for the region where the pad 141*a* is formed. However, the height of the first region R1 of the second-first insulating layer 121 is lower than the height of the pad 141*a*. Accordingly, the electronic device 180*a* may be stably mounted on the pad 141*a* without being affected by the second-first insulating layer 121 on the first region R1. In other words, when the height of the first region R1 of the second-first insulating layer 121 is higher than the height of the pad 141*a*, the electronic device 180*a* may be mounted on the pad 141*a* in an inclined state, and furthermore, a defect may occur in an electrical connection state with the pad 141*a*.

On the other hand, the inner walls 161 and 162 and the bottom surface 164 of the cavity 160 in the embodiment are not flat, but may have a certain curvature. In other words, the inner walls 161 and 162 and the bottom surface 164 of the cavity 160 may have a surface roughness of at least a certain level. That is, the inner walls 161 and 162 and the bottom surface 164 of the cavity 160 may have roughness.

In the embodiment, the molding layer 190 is disposed in contact with the inner walls 161 and 162 and the bottom surface 164 of the cavity 160. At this time, the inner walls 161 and 162 and the bottom surface 164 of the cavity 160 are not flat but have a certain curve. The structure of the cavity 160 as described above can increase the surface area in contact with the molding layer 190, thereby improving the bonding force between the molding layer 190 and the printed circuit board 100.

According to an embodiment, the printed circuit board includes a cavity. In this case, the cavity 160 has a non-penetrating structure rather than a penetrating structure through the second insulating layer 120. In this case, the cavity 160 exposes the pad 141*a* disposed on the first insulating layer 110. In addition, the bottom surface of the cavity 160 is positioned lower than the upper surface of the pad 141*a*. Accordingly, the embodiment does not need to form an additional layer to form the cavity 160, and accordingly, the number of processes can be reduced. In addition, the embodiment can solve a loss due to a change in the thickness or shape of the pad 141*a* that occurs in the process of removing the additional layer, and accordingly, product reliability may be improved.

In addition, the cavity 160 of the printed circuit board of the embodiment includes a first inner wall 161 having a first inclination angle with respect to the inflection point 163, a second inner wall 162 having a second inclination angle, and a bottom surface 164 extending from the second inner wall 163. In this case, the first inner wall 161, the second inner wall 162, and the bottom surface 164 of the cavity of the cavity 160 may not be flat and may have a predetermined surface roughness. In addition, an electronic device may be mounted on the pad 141*a* in the cavity 160. In addition, the molding layer 190 may be disposed in the cavity 160 to cover the electronic device. At this time, the inner wall and the bottom surface 164 of the cavity 160 have a certain surface roughness, so that a surface area in contact with the molding layer 190 can be increased, and accordingly, bonding strength may be improved during molding of the molding layer 190.

Hereinafter, a method of manufacturing a printed circuit board according to an embodiment will be described with reference to the accompanying drawings.

FIGS. 5 to 9 are views showing a method of manufacturing the printed circuit board shown in FIG. 1 in order of process, and FIG. 10 is an enlarged photomicrograph of a cavity of a printed circuit board according to an embodiment.

Referring to FIG. 5, the first insulating layer 110 may be prepared, first and second circuit patterns 141 and 142 may be formed on the surfaces of the first insulating layer 110, and the first via V1 passing through the first insulating layer 110 and electrically connecting the first and second circuit patterns 141 and 142 may be formed.

The first insulating layer 110 may be a prepreg. The prepreg (PPG) has good flowability and adhesion in a semi-cured state, is used as an intermediate substrate for a fiber-reinforced composite material used as an adhesive layer and an insulating material layer, and is a molding material in which reinforcing fibers are pre-impregnated with a matrix resin. A molded article is formed by laminating these prepregs and curing the resin by heating/pressing. That is, the prepreg refers to a material that is impregnated with resin (BT/Epoxy, FR4, FR5, etc.) into glass fiber and cured to B-stage.

That is, the first insulating layer 110 may be a thermosetting or thermoplastic polymer substrate, a ceramic substrate, an organic-inorganic composite material substrate, or a glass fiber-impregnated substrate, may include an epoxy-based insulating resin when the first insulating layer includes a polymer resin, or alternatively, it may include a polyimide-based resin.

That is, the first insulating layer 110 is a substrate on which an electric circuit capable of changing wiring is formed, and may include a printed circuit board and an insulating substrate made of an insulating material capable of forming circuit patterns on the surface thereof.

A metal layer (not shown) is laminated on the surface of the first insulating layer 110. The metal layer may be formed by electroless plating a metal including copper on the first insulating layer 110. In addition, unlike the formation of the metal layer by electroless plating on the first insulating layer 110, Copper Clad Laminate (CCL) may be used.

When the metal layer is formed by electroless plating, roughness is provided to the upper surface of the first insulating layer 110 so that plating can be performed smoothly. Then, the first and second circuit patterns 141 and 142 are respectively formed on the upper and lower surfaces of the first insulating layer 110 by patterning the metal layer. In this case, the first circuit pattern 141 may include a pad 141*a* connected to the electronic devices 180 and 180*a* to be mounted on the first insulating layer 110 later through the connection portion 170.

As described above, the first and second circuit patterns 141 and 142 may be formed using an additive process, a subtractive process, a modified semi additive process (MSAP), and a semi additive process (SAP), which are typical printed circuit board manufacturing processes, and a detailed description will be omitted here.

Next, referring to FIG. 6, a process of laminating the second insulating layer 120 and the third insulating layer 130 on upper and lower surfaces of the first insulating layer 110 may be performed, respectively.

In this case, the second insulating layer 120 has a plurality of layer structures. For example, the second insulating layer 120 may include a second-first insulating layer 121 disposed on an upper surface of the first insulating layer 110, a second-second insulating layer 122 disposed on an upper surface of the second-first insulating layer 121, and a second-third insulating layer 123 disposed on an upper surface of the second-second insulating layer 122.

In addition, the third insulating layer 130 has a plurality of layer structures. For example, the third insulating layer 130 may include a third-first insulating layer 131 disposed under a lower surface of the first insulating layer 110, a third-second insulating layer 132 disposed under a lower surface of the third-first insulating layer 131, and a third-third insulating layer 132 disposed under a lower surface of the third-second insulating layer 132

In addition, a process of forming a circuit pattern on the surface of the second insulating layer 120 may be performed. For example, a process of forming a plurality of third circuit patterns 143 spaced apart from each other by a predetermined distance on the upper surface of the second-first insulating layer 121 may be performed. In addition, a process of forming a plurality of fourth circuit patterns 144 spaced apart from each other by a predetermined distance may be performed on the upper surface of the second-second insulating layer 122. In addition, a process of forming a plurality of fifth circuit patterns 145 spaced apart from each other by a predetermined distance on the upper surface of the second-third insulating layer 123 may be performed.

In addition, a process of forming a circuit pattern on the surface of the third insulating layer 130 may be performed. For example, a process of forming a plurality of sixth circuit patterns 146 spaced apart from each other by a predetermined distance on the lower surface of the third-first insulating layer 131 may be performed. In addition, a process of forming a plurality of seventh circuit patterns 147 spaced apart from each other by a predetermined distance on the lower surface of the third-second insulating layer 132 may be performed. In addition, a process of forming a plurality of eighth circuit patterns 148 spaced apart from each other by a predetermined distance on the lower surface of the third-third insulating layer 133 may be performed.

In addition, a process of forming vias V1, V2, V3, V4, V5, V6, and V7 for electrically connecting circuit patterns disposed on different layers in the first insulating layer 110, the second insulating layer 120, and the third insulating layer 130 may be performed.

Next, referring to FIG. 7, a process of forming the cavity 160 in a cavity region of the second insulating layer 120 may be performed. In this case, the cavity 160 may be formed in the second insulating layer 120 composed of a plurality of layers.

In this case, the cavity 160 may be formed through a plurality of different processes.

That is, a laser process may be performed as a first cavity forming step for forming the cavity 160.

In this case, before the forming of the first cavity, the mask 310 may be formed in the remaining region of the upper surface of the second insulating layer 120, except for the region in which the cavity 160 is to be formed. The mask 310 may be a metal layer. For example, the mask 310 may be formed of a metal material including copper.

That is, the mask 310 may be formed of a material that is not etched during laser and plasma processes, and may be, for example, a metal layer including copper.

The mask 310 may have a thickness of 0.1 μm to 12 μm. When the mask 310 is smaller than 0.1 μm, the mask may not function normally, and accordingly, a cavity may be formed in a region where the cavity should not be formed.

In addition, when the mask 310 is larger than 12 μm, other circuit patterns may be damaged in the process of removing the mask 310.

Next, as shown in FIG. 8, a first cavity forming step is performed on the second insulating layer 120 using a laser to form a first part 160*a* of the cavity 160. Thereafter, as shown in FIG. 9, a second cavity forming step is performed through a plasma process to form a second part 160*b* of the cavity 160 under the first part 160*a*.

Accordingly, the cavity 160 may include a first part disposed in the second-first insulating layer 121, a second part disposed in the second-second insulating layer 122, and a second-third insulating layer 123 disposed in the second-third insulating layer. Here, as the second insulating layer 122 in the embodiment has a three-layer structure, the cavity 160 is illustrated as being composed of first to third parts, but the embodiment is not limited thereto. For example, when the second insulating layer 120 has a two-layer structure, the cavity 160 may include only the first and second parts. For example, when the second insulating layer 122 has a five-layer structure, the cavity 160 may include first to fifth parts. However, the cavity 160 in the embodiment is characterized in that the lowermost part has a groove shape rather than a through hole shape.

Next, as shown in FIG. 9, the protective layers 151 and 152 are formed on the outermost portions of the second insulating layer 120 and the third insulating layer 130 after the mask 310 used to form the cavity 160 is removed.

For example, the first protective layer 151 may be disposed on the upper surface of the insulating layer disposed on the top of the plurality of insulating layers. For example, the first protective layer 151 may be disposed on an upper surface of the second-third insulating layer 123 disposed on the uppermost portion of the second insulating layer 120. In addition, the second protective layer 152 may be disposed on a lower surface of the insulating layer disposed on the lowermost portion among the plurality of insulating layers. For example, the second protective layer 152 may be disposed on the lower surface of the third-third insulating layer 133 disposed on the lowermost portion of the third insulating layer 130.

The first protective layer 151 and the second protective layer 152 may each have an opening. For example, the first protective layer 151 may have an opening exposing the surface of the fifth circuit pattern to be exposed among the fifth circuit patterns 145 disposed on the upper surface of the second-third insulating layer 123.

In addition, the second protective layer 152 may have an opening exposing the surface of the eighth circuit layer to be exposed among the eighth circuit layers 148 disposed on the lower surface of the third-third insulating layer 133. Accordingly, as shown in FIG. 10, the cavity 160 is formed through a plurality of processes and may be divided into a plurality of parts having different inclination angles.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

The invention claimed is:

1. A circuit board comprising:

a base insulating layer;

an upper insulating layer disposed on the base insulating layer and including a cavity;

a circuit pattern embedded in the upper insulating layer;

an electronic device disposed in the cavity of the upper insulating layer; and a protective layer disposed on the upper insulating layer, wherein the upper insulating layer includes an inner wall surface forming the cavity, wherein the inner wall surface includes a first surface having a first inclination angle with respect to an upper surface of the base insulating layer, a second surface extending from the first surface toward the protective layer and having a second inclination angle smaller than the first inclination angle with respect to the upper surface of the base insulating layer, and a contact portion where the first surface and the second surface are in contact, wherein the circuit pattern includes a portion overlapping the second surface of the inner wall surface along a horizontal direction, wherein the portion of the circuit pattern includes an upper surface and a lower surface, and wherein a first distance in a vertical direction between the upper surface of the base insulating layer and the contact portion is smaller than a second distance in the vertical direction between the upper surface of the portion of the circuit pattern and the upper surface of the base insulating layer.

2. The circuit board of claim 1, wherein the portion of the circuit pattern does not overlap the first surface of the inner wall surface along the horizontal direction.

3. The circuit board of claim 2, wherein a third distance in the vertical direction between the lower surface of the portion of the circuit pattern and the upper surface of the base insulating layer is equal to or greater than the first distance.

4. The circuit board of claim 2, wherein the electronic device overlaps the contact portion, the first surface, and the second surface along the horizontal direction.

5. The circuit board of claim 4, wherein the protective layer includes a through hole passing through an upper surface of the protective layer and a lower surface of the protective layer, and wherein a width in the horizontal direction of the through hole greater than a width of the electronic device.

6. The circuit board of claim 2, further comprising:

a first via electrode disposed between the lower surface of the portion of the circuit pattern and the base insulating layer, and wherein the first via electrode overlaps the first surface of the inner wall surface along the horizontal direction.

7. The circuit board of claim 6, wherein the first via electrode overlaps the contact portion and the electronic device along the horizontal direction.

8. The circuit board of claim 7, further comprising:

a second via electrode disposed on the upper surface of the portion of the circuit pattern, and wherein the second via electrode overlaps the second surface of the inner wall surface along the horizontal direction.

9. The circuit board of claim 8, wherein the second via electrode overlaps the first via electrode along the vertical direction.

10. The circuit board of claim 2, further comprising:

a top insulating layer disposed on the upper insulating layer and filling the cavity, and wherein the top insulating layer fills the cavity to cover exposed surfaces of the upper insulating layer including the first and second surfaces.

11. The circuit board of claim 10, wherein a fourth distance layer in the vertical direction between an upper surface of the electronic device and the upper surface of the base insulating is greater than a fifth distance in the vertical direction between the upper surface of the base insulating layer and the upper surface of the upper insulating layer.

12. The circuit board of claim 10, wherein the top insulating layer includes a material different from a material of the upper insulating layer.

13. A circuit board comprising:

a base insulating layer;

an upper insulating layer disposed on the base insulating layer and includes a cavity;

a circuit pattern embedded in the upper insulating layer; and an electronic device disposed in the cavity of the upper insulating layer, wherein the upper insulating layer includes an inner wall surface forming the cavity, wherein the inner wall surface includes a first surface having a first inclination angle with respect to an upper surface of the base insulating layer, a second surface extending from the first surface toward an upper surface of the upper insulating layer and having a second inclination angle smaller than the first inclination angle with respect to the upper surface of the base insulating layer, and a contact portion where the first surface and the second surface are in contact, wherein the circuit pattern includes a first circuit pattern overlapped with the first surface in a horizontal direction, and a second circuit pattern overlapped with the second surface in the horizontal direction, and wherein the contact portion is positioned between a lower surface of the first circuit pattern and an upper surface of the second circuit pattern.

14. The circuit board of claim 13, further comprising:

a first via electrode disposed between the first circuit pattern and the second circuit pattern, and wherein the first via electrode overlaps the first surface and the contact portion along the horizontal direction.

15. The circuit board of claim 13, wherein the second circuit pattern does not overlap the first surface along the horizontal direction, and wherein a height of the lower surface of the second circuit pattern is higher than or equal to a height of the contact portion.

16. The circuit board of claim 13, wherein the electronic device overlaps the contact portion, the first surface, and the second surface along the horizontal direction.

17. The circuit board of claim 13, further comprising:

a protective layer disposed on the upper insulating layer, wherein the protective layer includes a through hole passing through an upper surface of the protective layer and a lower surface of the protective layer, and wherein a width in the horizontal direction of the through hole greater than a width of the electronic device.

18. The circuit board of claim 14, further comprising:

a second via electrode disposed on the second circuit pattern and overlapping the first via electrode in a vertical direction, and wherein the second via electrode overlaps the second surface of the inner wall surface along the horizontal direction.

19. The circuit board of claim 13, further comprising:

a top insulating layer disposed on the upper insulating layer and filling the cavity, and wherein the top insulating layer fills the cavity to cover exposed surfaces of the upper insulating layer including the first and second surfaces.

20. The circuit board of claim 19, wherein an upper surface of the electronic device is positioned higher than an upper surface of the upper insulating layer.

* * * * *